United States Patent
Yang et al.

(10) Patent No.: US 9,142,312 B1
(45) Date of Patent: *Sep. 22, 2015

(54) ADAPTING READ REFERENCE VOLTAGE IN FLASH MEMORY DEVICE

(71) Applicant: MARVELL INTERNATIONAL LTD., Hamilton (BM)

(72) Inventors: Xueshi Yang, Cupertino, CA (US); Gregory Burd, San Jose, CA (US)

(73) Assignee: Marvell International Ltd. (BM)

( * ) Notice: Subject to any disclaimer, the term of this patent is extended or adjusted under 35 U.S.C. 154(b) by 0 days.

This patent is subject to a terminal disclaimer.

(21) Appl. No.: 14/179,919

(22) Filed: Feb. 13, 2014

Related U.S. Application Data

(63) Continuation of application No. 13/735,256, filed on Jan. 7, 2013, now Pat. No. 8,659,942, which is a continuation of application No. 13/008,958, filed on Jan. 19, 2011, now Pat. No. 8,351,258.

(60) Provisional application No. 61/297,564, filed on Jan. 22, 2010.

(51) Int. Cl.
G11C 16/00 (2006.01)
G11C 16/28 (2006.01)
G11C 16/34 (2006.01)

(52) U.S. Cl.
CPC ............ *G11C 16/28* (2013.01); *G11C 16/3404* (2013.01)

(58) Field of Classification Search
CPC ........ G11C 16/00; G11C 16/28; G11C 16/34; G11C 16/3404
USPC ........................... 365/185.03, 185.24, 185.33
See application file for complete search history.

(56) References Cited

U.S. PATENT DOCUMENTS

| | | | |
|---|---|---|---|
| 6,151,246 A | 11/2000 | So et al. | |
| 6,747,894 B2 | 6/2004 | Kawamura | |
| 6,831,858 B2 | 12/2004 | Hirano et al. | |
| 7,848,152 B1 | 12/2010 | Huang et al. | |
| 7,889,563 B2 * | 2/2011 | Cho et al. | 365/185.2 |
| 8,351,258 B1 * | 1/2013 | Yang et al. | 365/185.03 |
| 8,659,942 B1 * | 2/2014 | Yang et al. | 365/185.03 |

\* cited by examiner

*Primary Examiner* — Tan T. Nguyen

(57) ABSTRACT

In one embodiment, a method comprises determining an adaptation for a reference voltage used in a flash memory device as a function of a first count of items read from the flash memory device and a second count of items read from the flash memory device; and shifting the reference voltage at least in part by the adaptation.

19 Claims, 11 Drawing Sheets

ADAPTING READ REFERENCE VOLTAGE IN FLASH MEMORY DEVICE

CROSS REFERENCE TO RELATED APPLICATIONS

This disclosure is a continuation of U.S. application Ser. No. 13/735,256 filed on Jan. 7, 2013 now U.S. Pat. No. 8,659,942, which is a continuation of U.S. application Ser. No. 13/008,958 filed on Jan. 19, 2011 now U.S. Pat. No. 8,351,258, which claims benefit under 35 USC §119(e) to U.S. provisional application Ser. No. 61/297,564 filed on Jan. 22, 2010, which are incorporated herein by reference in their entirety.

BACKGROUND

Flash memory is a type of memory used for non-volatile computer storage. Flash memory does not require power to maintain the information stored on the chip. However, over time, a charge distribution in cells in the flash memory may change. Therefore, a reference voltage ($V_{ref}$) used to correctly read a value from a location in a flash memory whose charge distribution has changed may need to be changed to avoid complications from the shifting charge distribution.

Flash memory stores information in an array of memory cells made from floating gate transistors. A single level cell (SLC) device stores one bit of information per cell while a multi-level cell (MLC) device stores more than one bit per cell. Flash memory stores data by programming the cell to different threshold voltage ($V_{th}$) values. In a one bit/cell flash (SLC), flash cells have one nominal $V_{th}$ while in a two bits/cell flash, cells have four nominal $V_{th}$ values. Both SLC and MLC devices may experience distribution charge shift and thus $V_{ref}$ adaptation may be desired for both types of devices. FIG. 1 illustrates charge distribution shifts in an SLC device. The solid lines labeled T1 illustrate the charge distribution before cycling and data retention while the dotted lines labeled T2 illustrate the charge distribution after cycling and data retention. FIG. 2 illustrates charge distribution shifts in an MLC device. Once again solid lines illustrate charge distribution before cycling and data retention and dotted lines illustrate charge distribution after cycling and data retention.

Flash memory devices may store both data and error correction data. Data retrieval is achieved by determining threshold voltage ($V_{th}$) of the flash cell where $V_{ref}$ is applied. The determination whether $V_{th} < V_{ref}$ or $V_{th} >= V_{ref}$ is made by sensing the drain-to-source current. The determination whether $V_{th} < V_{ref}$ or $V_{th} >= V_{ref}$ controls whether the value read is interpreted as being a one or a zero. The error correction data may take the form of an error correcting code (ECC). When data is read from a flash memory cell, a determination can be made concerning whether the data was read correctly by referencing the ECC. For example, the ECC may help determine whether a value interpreted as a one is supposed to be interpreted as a one.

Data that originally was stored properly and read correctly may, over time, be read incorrectly due, for example, to the changing charge distribution. In an SLC device, there are two types of bit errors, a zero that is incorrectly read as a one, and a one that is incorrectly read as a zero. FIG. 3 illustrates an overlap between charge distributions. The overlap is the area where bit errors may be experienced due to charge distribution shift. Region E01 represents an area where a zero may be incorrectly read as a one and region E10 represents an area where a one may be incorrectly read as a zero. The position of $V_{ref}$ will determine the size of regions E01 and E10, and thus will determine whether there is a higher likelihood of errors where a zero is incorrectly read as a one (E0-1) or of errors where a one is incorrectly read as a zero (E1-0).

Several conventional approaches have been employed to try to manipulate $V_{ref}$ in attempts to improve a bit error rate (BER) for a flash memory device. However, these approaches may have been slow, inefficient, or may have required multiple reads of a cell. One conventional approach involved doing multiple precise analog read outs using multiple fractional reference voltages in an attempt to fully understand where the charge distribution is positioned. While accurate, this approach may have yielded undesired consequences. For example, flash cells may only be able to experience a finite number of read cycles before wear begins to negatively impact the integrity of the storage. The negative impact can be, for example, the charge distribution shift. Therefore it may be unwise to force a flash location to undergo multiple read cycles while trying to figure out a $V_{ref}$ adaptation to account for charge distribution shift caused by wear associated with PE cycles. It may be unwise to figure out the $V_{ref}$ adaptation using an approach that can contribute to further charge distribution shifts.

One reliability issue with MLC flash memory devices is that the margins between different nominal $V_{th}$ shrink comparing to SLC flash memory devices and therefore the tolerance to noise/disturbances reduces significantly. Therefore, $V_{th}$ shift issues may be more complicated in MLC flash memory devices.

SUMMARY

In one aspect of the disclosure, a method comprises determining an adaptation for a reference voltage used in a flash memory device as a function of a first count of items read from the flash memory device and a second count of items read from the flash memory device; and shifting the reference voltage at least in part by the adaptation.

In another aspect of the disclosure, an apparatus for adapting reference voltages in a flash memory device comprises reference voltage logic configured to determine a reference voltage associated with the flash memory device; and adaptation logic configured to determine a reference voltage adaptation for the flash memory device as a function of (i) a number of first items determined by reading the flash memory device using the reference voltage, and (ii) a number of second items determined by reading the flash memory device using the reference voltage. The adaptation logic is configured to shift the reference voltage by an amount based at least in part on the reference voltage adaptation.

In another aspect of the disclosure, a memory device, comprises memory cells and read logic configured to read values from the memory cells, wherein the read logic is configured to use a reference voltage. Adaptation logic configured to determine an adaptation for the reference voltage as a function of a first count of values read from the memory cells and a second count of values read from the memory cells; wherein the adaptation logic is configured to adjust the reference voltage at least in part by the adaptation.

In another aspect of the disclosure, the first count of values are a number of one values read from the memory cells and the second count of values are a number of zero values read from the memory cells.

BRIEF DESCRIPTION OF THE DRAWINGS

The accompanying drawings, which are incorporated in and constitute a part of the specification, illustrate various apparatuses, methods, and other embodiments of the disclosure. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Examples of apparatuses and methods compute a reference voltage adaptation for a flash memory device. Examples adjust $V_{ref}$ on-the-fly in response to reading the flash memory device. Examples of the apparatuses and methods read a flash memory device using a reference voltage and determine counts for first items and for second items. In one example, the first and second items are just the ones and zeroes read from the flash memory device. In another example, the first and second items are one to zero error counts and zero to one error counts experienced by the flash memory device. Examples of apparatuses and methods then compute an adaptation to the reference voltage as a function of a difference between the counts. If there were more ones than there should have been, then the examples of apparatuses and methods change $V_{ref}$ so that there will be fewer ones. If there were more zeroes than there should have been, then examples of apparatuses and methods change $V_{ref}$ so that there will be fewer zeroes. If there were too many one to zero errors, then example apparatuses and methods change $V_{ref}$ to reduce the number of one to zero errors. If there were too many zero to one errors, then example apparatuses and methods change $V_{ref}$ to reduce the number of zero to one errors. A $V_{ref}$ adaptation for a single part of a vector may be used to adapt other parts of a vector.

Conventionally, NAND flash memory devices may have relied on ECC to compensate for bits that failed during regular operation. ECC may have facilitated detecting and even correcting bit errors. Some examples of apparatus and methods rely on an awareness of the number and types of bit errors to facilitate establishing a new $V_{ref}$ based on a current $V_{ref}$. Some examples of apparatus and methods may rely on pure bit counts to facilitate establishing a new $V_{ref}$. The $V_{ref}$ adaptation is designed to reduce the number of bit errors.

Figure 1:
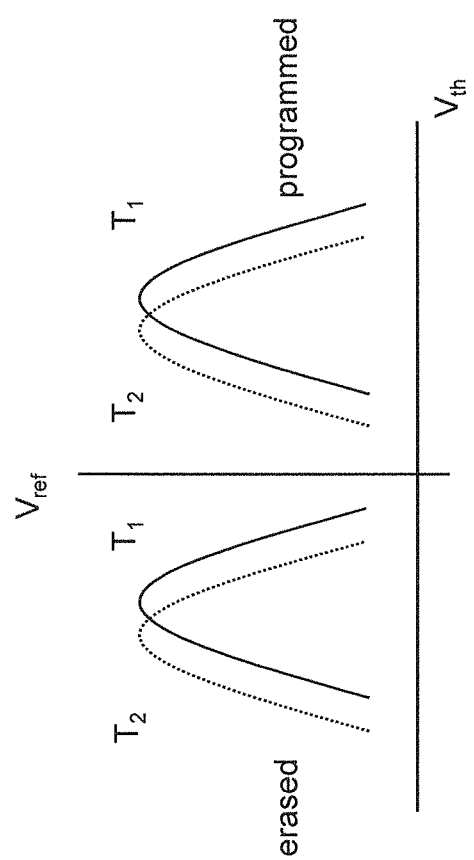
FIG. 1 illustrates charge distribution shifts in an SLC device.
Figure 2:
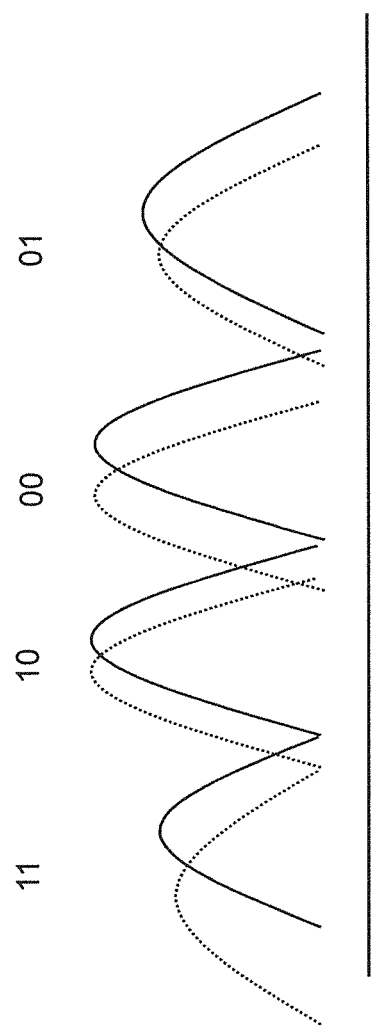
FIG. 2 illustrates charge distribution shifts in an MLC device.
Figure 3:
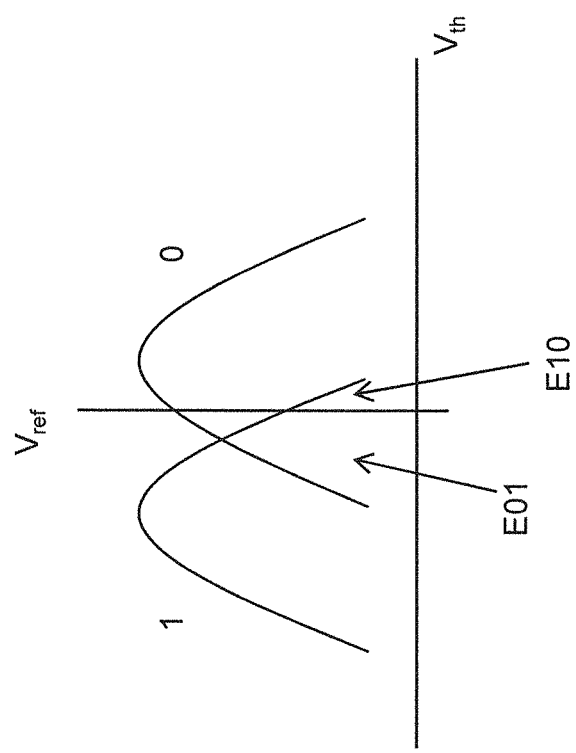
FIG. 3 illustrates an overlap between charge distributions.
Figure 4:
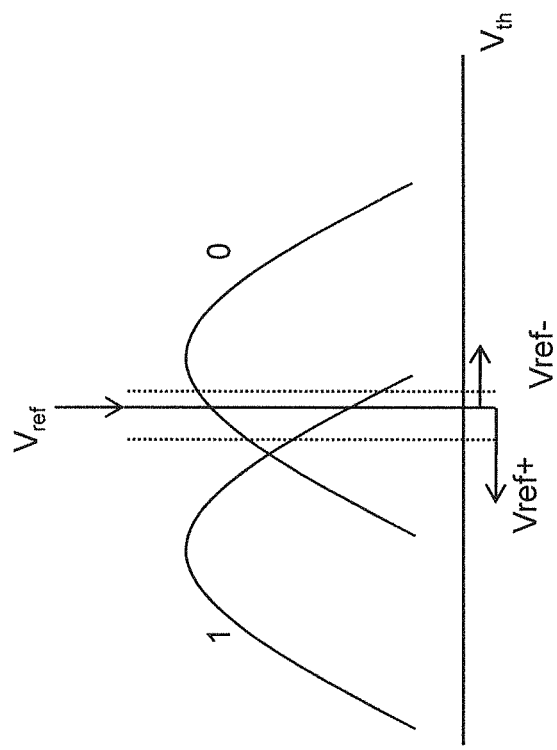
FIG. 4 illustrates two different types of $V_{ref}$ adaptations.

FIG. 4 illustrates two different types of $V_{ref}$ adaptations: $V_{ref-}$ and $V_{ref+}$. The $V_{ref}$ may be shifted in either direction. Shifting the $V_{ref}$ in one direction will reduce the number of zeroes that are read incorrectly as ones while shifting the $V_{ref}$ in the opposite direction will reduce the number of ones that are read incorrectly as zeroes. Therefore, examples of apparatuses and methods may determine the proper direction to shift $V_{ref}$. In FIG. 4, it appears that bit errors would be reduced by shifting the $V_{ref}$ to the left while bit errors would be increased by shifting $V_{ref}$ to the right.

Figure 5:
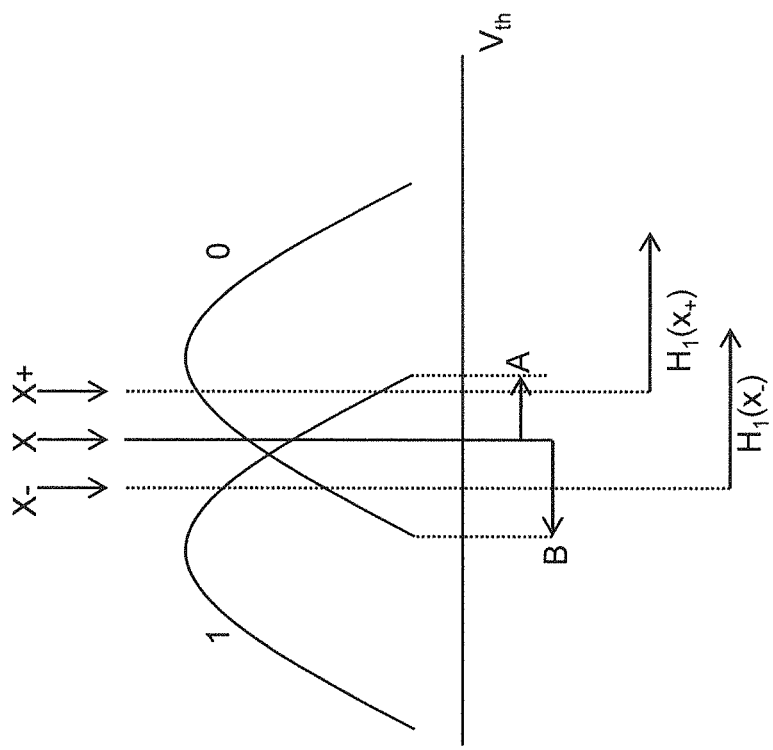
FIG. 5 illustrates charge distributions associated with a 1 bit/cell flash.

Histogram count regions associated with a derivation of a $V_{ref}$ adaptation are illustrated in FIG. 5. FIG. 5 illustrates charge distributions associated with a 1 bit/cell flash. One goal of $V_{ref}$ adaptation is to minimize the bit error rate. Minimizing the bit error rate is equivalent to minimizing the integrated area under the two distributions that cross the reference voltage X. A represents the entire region of distribution corresponding to bit 1 on the right of X while B represents the entire region of distribution corresponding to bit 0 on the left of X. To minimize $(A+B)^2$, fractional reads would be required. The fractional reads would involve doing reads while applying the reference voltages $x_+$ and $x_-$ in addition to doing reads while applying the $V_{ref}$ x. The fractional reads and the $V_{ref}$ read would produce counts of errors associated with $x_+$ and x. The counts of reads associated with $x_+$ may be referred to as $H(x_+)$ while the count of reads associated with $x_-$ may be referred to as $H(x_-)$. Given this notation, the following derivation can be computed:

$$x_{k+1} = x_k - \alpha(A+B)\frac{\partial(A+B)}{\partial x}$$

$$= x_k - \alpha e\left(\frac{\partial A}{\partial x} + \frac{\partial B}{\partial x}\right)$$

$$= x_k - \alpha e([e_{1->0}(x_+) - e_{1->0}(x_-)] + [e_{0->1}(x_+) - e_{0->1}(x_-)])/\partial x$$

$$= x_k - \alpha e(-H_1(x_-, x_+) + H_0(x_-, x_+))/\partial x$$

where,
$X_k$ refers to the current $V_{ref}$,
$X_{k+1}$ refers to the new $V_{ref}$,
$H_0$ is the zero to one error histogram count from $x_-$ to $x_+$,
$H_1$ is the one to zero error histogram count from $x_-$ to $x_+$,
e refers to the total number of errors, and
$\alpha$ is a constant.

While this formula associated with fractional reads is interesting and useful, some examples of apparatus and methods may not use fractional reads. Therefore, an approximation of the minimization can be produced using only binary read out values. When only binary read out values are used, the following approximation may be employed:

$$x_{k+1} = x_k - \alpha(A+B)\frac{\partial(A+B)}{\partial x}$$

$$= x_k - \alpha e\left(\frac{\partial A}{\partial x} + \frac{\partial B}{\partial x}\right)$$

$$= x_k - \alpha e([e_{1->0}(x_+) - e_{1->0}(x_-)] + [e_{0->1}(x_+) - e_{0->1}(x_-)])/\partial x$$

$$= x_k - \alpha e(-H_1(x_-, x_+) + H_0(x_-, x_+))/\partial x$$

$$\approx x_k - \beta e(e_{0->1} - e_{1->0})$$

where
- $X_k$ refers to the current $V_{ref}$,
- $X_{k+1}$ refers to the new $V_{ref}$,
- e refers to the total number of errors,
- $e_{1 \to 0}$ refers to number of ones read incorrectly as zeroes,
- $e_{0 \to 1}$ refers to number of zeroes read incorrectly as ones,
- $\alpha$ is a constant, and
- $\beta$ is a constant.

In this approximation, the $V_{ref}$ adaptation is weighted by the number of errors. The direction that $V_{ref}$ will be shifted depends on the whether there are more $0 \to 1$ errors or more $1 \to 0$ errors. Thus, in one embodiment, $V_{ref}$ adaptation is based on binary read out of the data stored in a flash memory device while in another embodiment, $V_{ref}$ adaptation is based on fractional read outs of the data stored in a flash memory device.

For certain types of data, the ECC data may not even need to be consulted. For example, for random data where there is expected to be an equal number of ones and zeroes, then counting the numbers of ones and zeroes will provide information upon which a $V_{ref}$ adaptation can be made. If there are more ones than zeroes, then $V_{ref}$ may need to be shifted in one direction while if there are more zeroes than ones, then $V_{ref}$ may need to be shifted in another direction. If there are an equal number of zeroes and ones, then $V_{ref}$ may still have an appropriate value. For this purely random data example, the approximation can be simplified to:

$$X_{k+1} = X_k - \gamma(e_{0 \to 1} - e_{1 \to 0}) \approx X_k - \gamma'[H_x(1) - H_x(0)]$$

where
- $X_k$ refers to the current $V_{ref}$,
- $X_{k+1}$ refers to the new $V_{ref}$,
- $H_x(1)$ is the number of ones read,
- $H_x(0)$ is the number of zeroes read,
- $e_{1 \to 0}$ refers to ones read incorrectly as zeroes,
- $e_{0 \to 1}$ refers to zeroes read incorrectly as ones, and
- $\gamma'$ is a constant.

While purely random data is described, simply determining the difference of ones to zeroes can be employed when the zero/one distribution is known ahead of time. If the zero/one distribution discovered during a read does not match the known zero/one distribution, then the $V_{ref}$ may be adapted on-the-fly similarly to the purely random data example.

Figure 6:
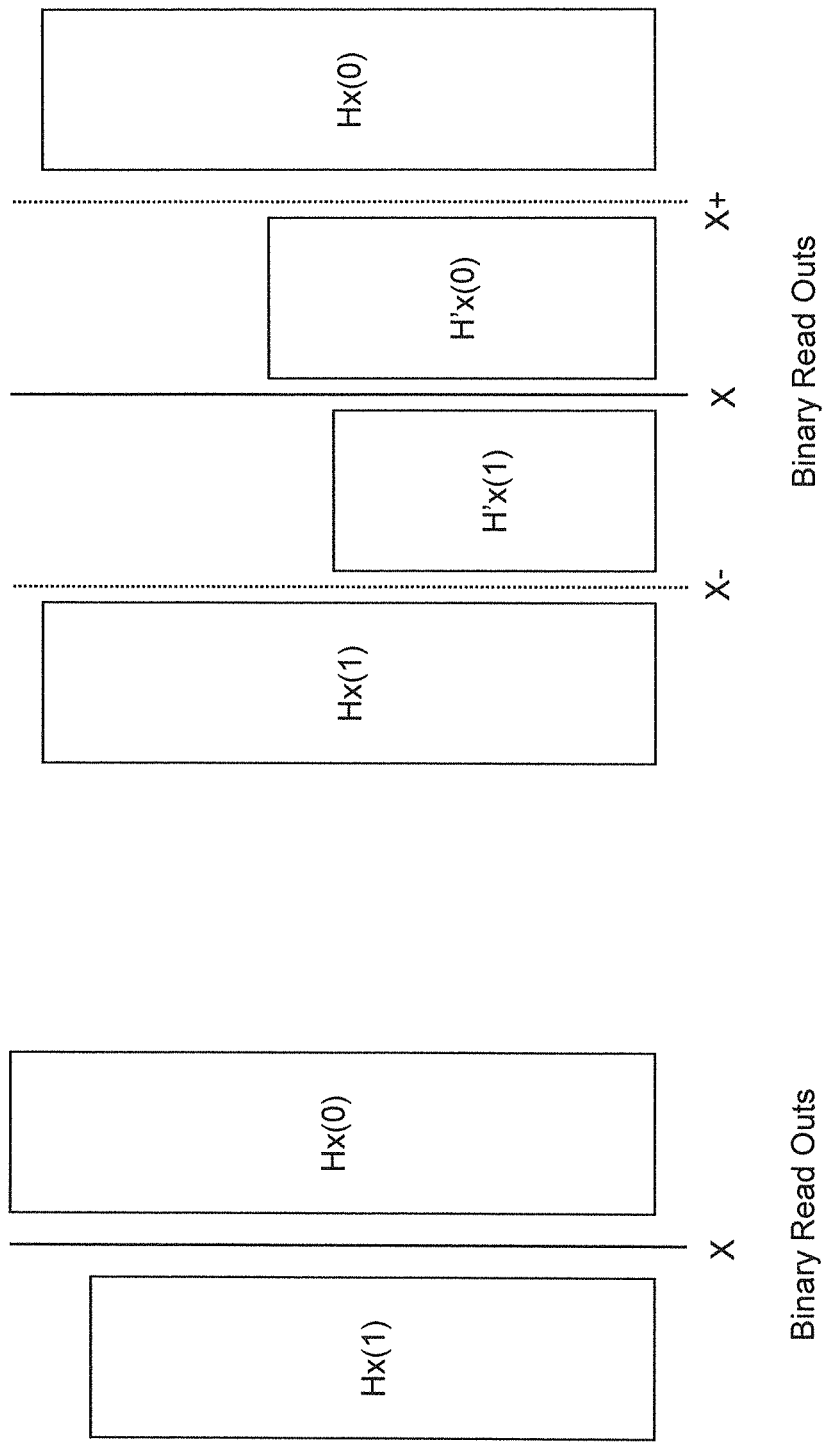
FIG. 6 illustrates the difference between a binary read out that yields $H_x(0)$ and $H_x(1)$ and a fractional readout that yields $H_x(0)$, $H'_x(0)$, $H'_x(1)$, and $H_x(1)$.

The previous example is based on binary readouts. FIG. 6 illustrates the difference between a binary read out that yields $H_x(0)$ and $H_x(1)$ and a fractional readout that yields $H_x(0)$, $H'_x(0)$, $H'_x(1)$, and $H_x(1)$. If multiple read out operations are undertaken with fractional reference voltages as illustrated in FIG. 6, then the following approximation can be made:

$$X_{k+1} \approx X_k - \gamma''[H'_x(1) - H'_x(0)]$$

where
- $X_k$ refers to the current $V_{ref}$,
- $X_{k+1}$ refers to the new $V_{ref}$,
- $H'_x(1)$ represents the corresponding value illustrated in FIG. 6,
- $H'_x(0)$ represents the corresponding value illustrated in FIG. 6, and
- $\gamma''$ is a constant.

Figure 7:
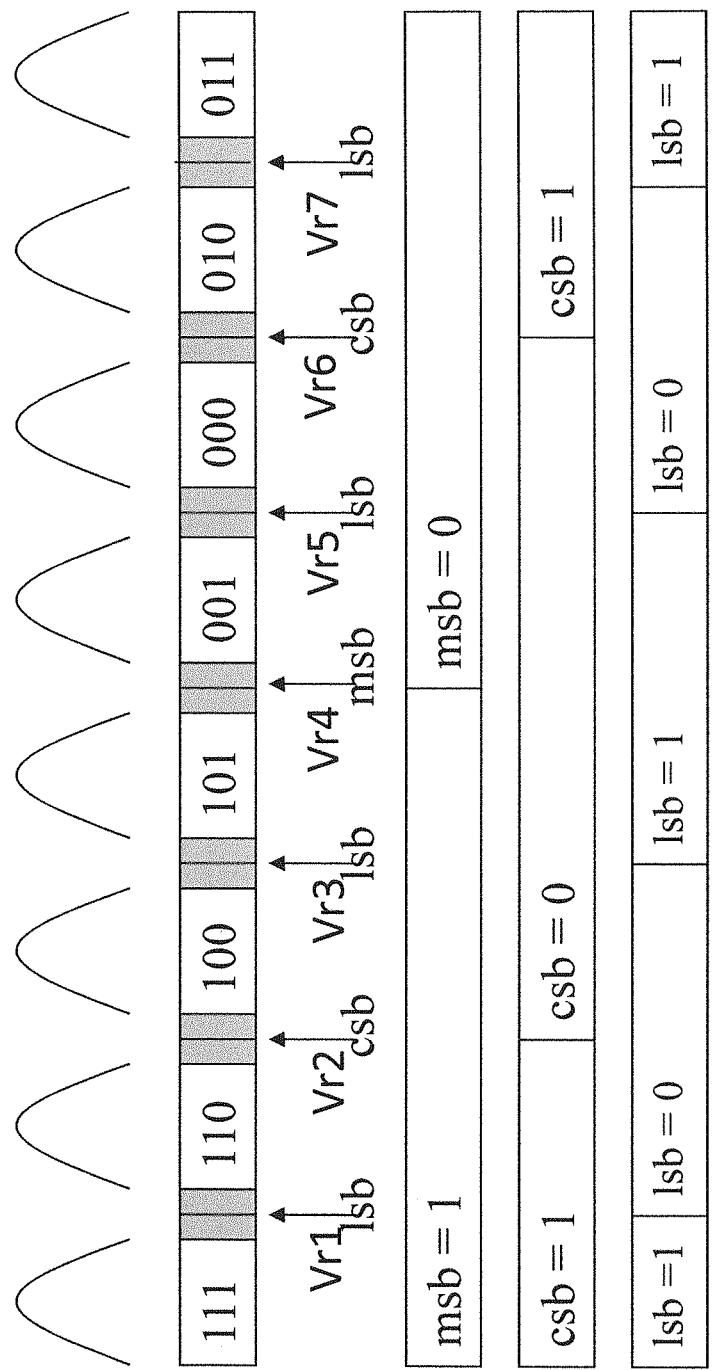
FIG. 7 illustrates a three bits/cell example that uses seven reference voltages to read values.

An SLC stores a single bit per cell. An MLC stores multiple bits per cell. For multi-bits per cell, more than one Vref is used to read out the multiple data bits. FIG. 7 illustrates a three bits/cell example that uses seven reference voltages to read values. If a delta for one Vref can be determined, then that delta may be used to correct the other Vref.

In FIG. 7, only the most significant bit (MSB) sees a binary phase shift keying (BPSK) channel (as in the 1 bit/cell case). The adaptation can be based on a binary readout only. The adaptation is based on a $V_{ref}$ vector profile where the adaptation for different bits can be based solely on the MSB information. For example, for a profile $V_{ref}$ vector [-6-2-4-3-3-5-4], which represents the read reference voltage deviation from a nominal vector value, a delta adaptation can be obtained for the element $V_{ref4}$, which corresponds to the MSB bit. Then, other $V_{ref}$ elements can be adapted similarly. For example:

$$V_{refk} = [-6-2-4-3-3-5-4]$$

where $V_{ref4}$ is adapted by delta leads to:

$$V_{refk+1} = [-6-2-4-3-3-5-4] + \text{delta}.$$

Therefore, in one embodiment, a determination is made concerning whether a flash memory device is experiencing more 0'1 errors than 1'0 errors or whether the flash memory device is experiencing more 1'0 errors than 0'1 errors. If the flash memory device is experiencing more 0'1 errors than 1'0 errors, then the $V_{ref}$ is shifted to reduce the difference and the shift amount is proportional to the difference. If the flash memory device is experiencing more 1'0 errors than 0'1 errors, then $V_{ref}$ is shifted to reduce the difference. In another embodiment, a determination is made concerning whether a flash memory device has more zeroes or ones. If the number of ones exceeds the number of zeroes, then $V_{ref}$ is shifted to reduce the difference and the shift amount is proportional to the difference. If the number of zeroes is more than the number of ones, then $V_{ref}$ is shifted to reduce the number of zeros and the shift amount is proportional to the difference. In different examples the read outs can be binary read outs or can include fractional read outs. In different examples the determination can be based on error correction information or on raw binary counts. In one example, a profile based adaptation can be used to adapt reference voltages for cells storing more than one bit/cell. In the profile based adaptation, multiple elements of a $V_{ref}$ vector are adapted based on determining one $V_{ref}$ delta for one $V_{ref}$ vector element. In different examples the multiple elements are adapted by the same delta or are adapted by a scaled amount of the delta. Different approximations may be employed.

Figure 8:
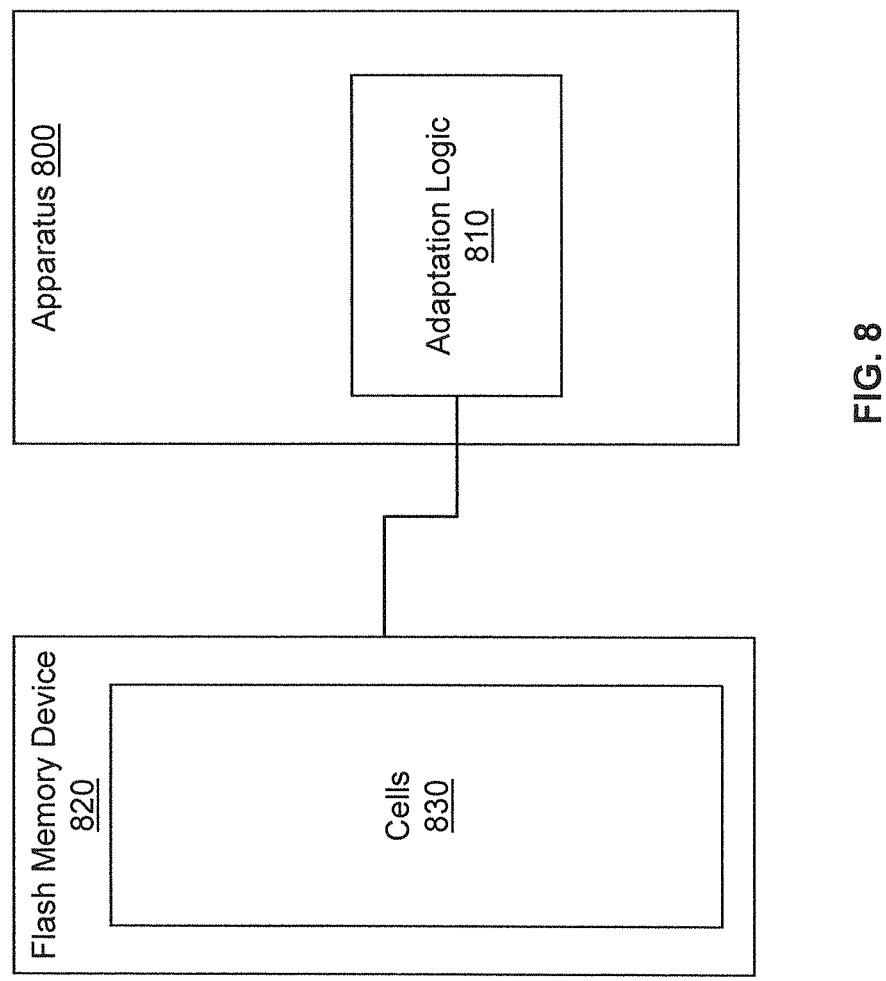
FIG. 8 illustrates an apparatus associated with adapting read reference voltages in flash memory devices.

FIG. 8 illustrates an apparatus 800 associated with adapting read reference voltages in flash memory devices in response to reading the flash memory devices and using values associated with the reading of the flash memory devices. Apparatus 800 includes an adaptation logic 810. Adaptation logic 810 is configured to determine a reference voltage adaptation for a flash memory device 820. Flash memory device 820 has cells 830. The reference voltage adaptation is determined as a function of a current reference voltage in use by the flash memory device 820, a total number of bit errors experienced by the flash memory device 820 during a read operation, and a difference of error types experienced by the flash memory device 820 during the read operation.

In one embodiment, the difference of error types compares a number of zero to one bit errors to a number of one to zero bit errors. In this embodiment, the adaptation logic 810 is configured to determine a reference voltage adaptation that will shift the reference voltage towards a Vth distribution associated with a zero value and the shift amount is proportional to the difference between error types. Also in this example, the adaptation logic 810 is configured to determine a reference voltage adaptation that will shift the reference voltage towards a Vth distribution associated with a one value and the shift amount is proportional to the difference between error types.

Figure 9:
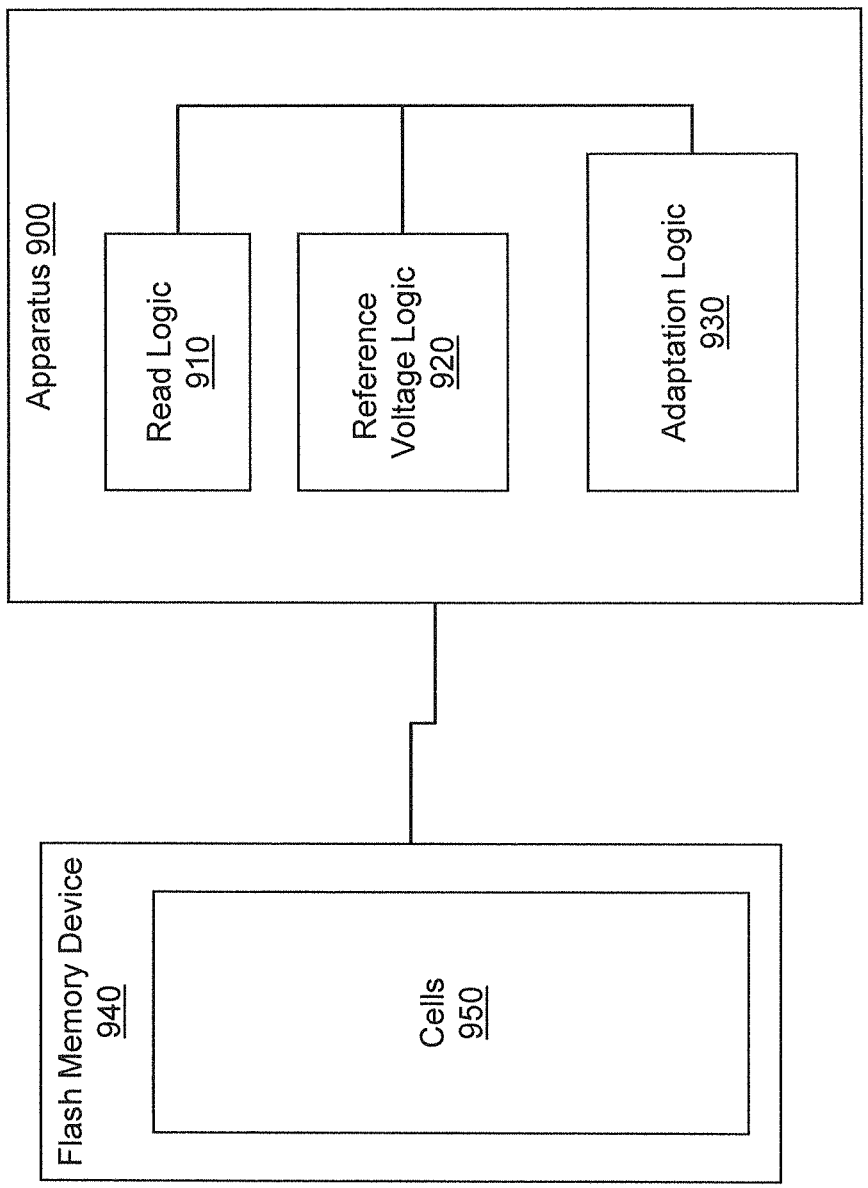
FIG. 9 illustrates an apparatus associated with adapting read reference voltages in flash memory devices.

FIG. 9 illustrates an apparatus 900 associated with adapting read reference voltages in flash memory devices. Apparatus 900 includes a read logic 910, a reference voltage logic 920, and an adaptation logic 930.

The read logic 910 is configured to read values from flash cells 950 in a flash memory device 940. The reference voltage logic 920 is configured to determine a current reference voltage associated with the flash memory device 940. The adaptation logic 930 is configured to determine a reference voltage adaptation for the flash memory device 940 on-the-fly using data associated with a read of the flash memory device 940. The adaptation is determined as a function of the current reference voltage, a count of the number of ones read from the flash cells, and a count of the number of zeroes read from the flash cells.

In one embodiment, the read logic 910 is configured to read the values using binary read outs. In this embodiment, the adaptation logic 930 is configured to determine the reference voltage adaptation according to:

$$\Delta xk = \beta'(H_x(1) - H_x(0))$$

where
  $\beta'$ is a constant,
  $H_x(1)$ is a count of the number of ones read, and
  $H_x(0)$ is a count of the number of zeroes read.

In another embodiment, the read logic 910 is configured to read the values using fractional read outs. In this embodiment, the adaptation logic 930 is configured to determine the reference voltage adaptation according to:

$$\Delta xk = \beta''(H'_x(1) - H'_x(0))$$

where
  $\beta''$ is a constant,
  $H'_x(1)$ is a count of the number of ones read during a first fractional read associated with a first fractional reference voltage, and
  $H'_x(0)$ is a count of the number of zeroes read during a second fractional read associated with a second fractional reference voltage.

Figure 10:
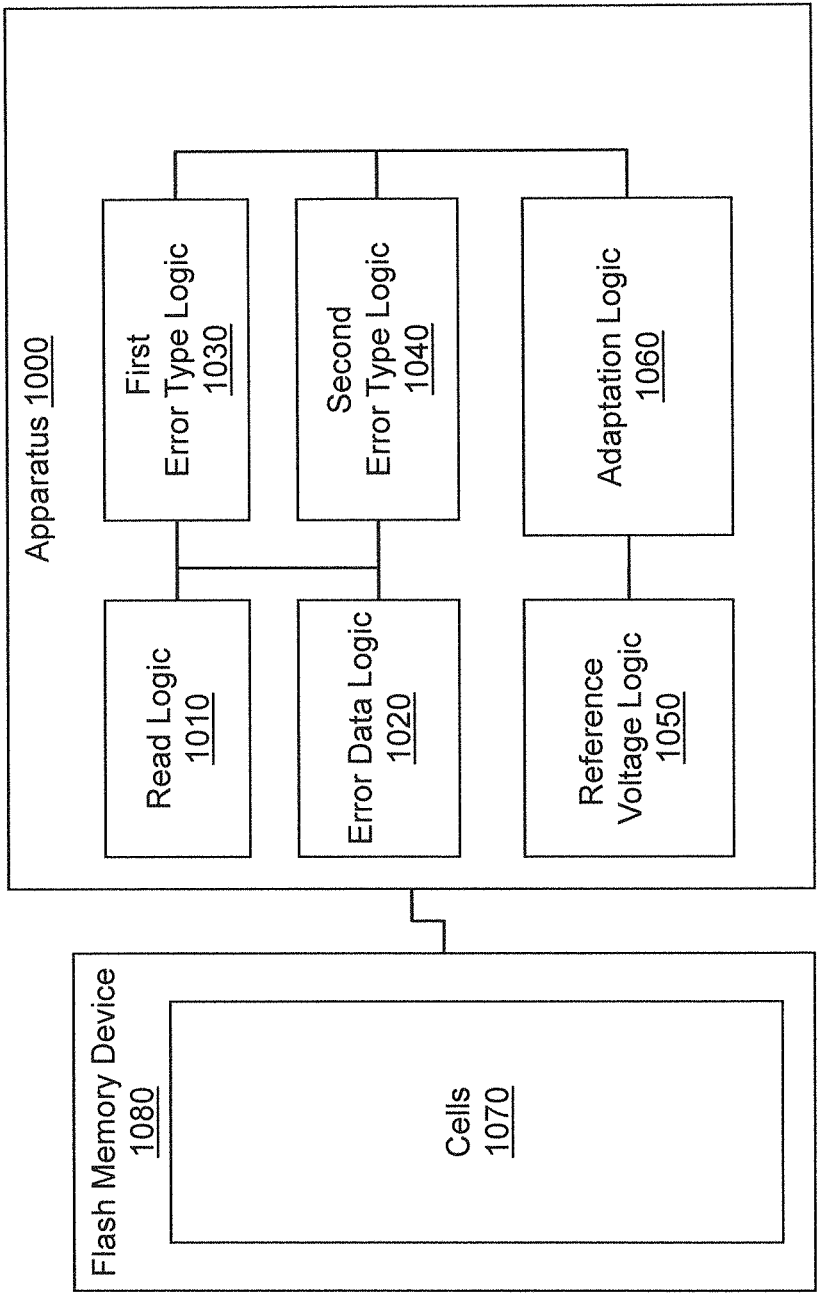
FIG. 10 illustrates an apparatus associated with adapting read reference voltages in flash memory devices.

FIG. 10 illustrates an apparatus 1000 associated with adapting read reference voltages in flash memory devices. Apparatus 1000 includes a read logic 1010, an error data logic 1020, a first error type logic 1030, a second error type logic 1040, a reference voltage logic 1050, and an adaptation logic 1060.

In one example, the read logic 1010 is configured to read values from flash cells 1070 in a flash memory device 1080. The error data logic 1020 is configured to read error correction values associated with the values. After reading the values and the error correction values, determinations concerning the number and type of errors experienced by the flash memory device 1080 can be made.

Therefore, in one embodiment, first error type logic 1030 is configured to determine a number of zero to one bit errors as a function of the values and the error correction values and the second error type logic 1040 is configured to determine a number of one to zero bit errors as a function of the values and the error correction values. One skilled in the art will appreciate that logics 1030 and 1040 could be combined into a single logic.

Reference voltage logic 1050 is configured to determine a current reference voltage associated with the flash memory device 1080. Adaptation logic 1060 is configured to determine a reference voltage adaptation for the flash memory device 1080. The adaptation can be computed as a function of the current reference voltage, the number of one to zero bit errors, the number of zero to one bit errors, and a total number of errors. The adaptation can be computed in response to a read of the flash memory device 1080 and using data (e.g., 0/1, errors) associated with the read.

In one embodiment, the read logic 1010 is configured to read values from the flash cells 1070 using binary read outs. In this embodiment the adaptation logic 1060 is configured to determine the reference voltage adaptation according to:

$$\Delta xk = \beta e(e_{0 \to 1} - e_{1 \to 0})$$

where
  $\beta$ is a constant,
  e is a total number of errors
  $e_{0 \to 1}$ is a number of zero to one errors, and
  $e_{1 \to 0}$ is a number of one to zero errors.

In another embodiment, the read logic 1010 is configured to read values from the flash cells 1070 using fractional read outs. In this embodiment, the adaptation logic 1060 is configured to determine the reference voltage adaptation according to:

$$\Delta xk = \beta e(-H_1(x_-, x_+) + H_0(x_-, x_+))/\alpha x$$

where
  $\Delta xk$ is the reference voltage adaptation,
  $\beta$ is a constant,
  $H_1(x_-, x_+)$ is a count of 1 to 0 error values associated with a first fractional read associated with a first fractional $V_{ref}x_-$; and
  $H_0(x_-, x_+)$ is a count of 0 to 1 error values associated with a second fractional read associated with a second fractional $V_{ref}x_+$.

Thus, more generally, the adaptation logic 1060 is configured to determine the reference voltage adaptation as a function of a difference between the number of one to zero bit errors and the number of zero to one bit errors. The adaptation logic 1060 is configured to determine a reference voltage adaptation that will shift the reference voltage towards a Vth distribution associated with a one value and the shift amount is proportional to the difference between the number of zero to one bit errors and the number of one to zero bit errors. The adaptation logic 1060 is also configured to determine a reference voltage adaptation that will shift the reference voltage towards a Vth distribution associated with a zero value and the shift amount is proportional to the difference between the number of zero to one bit errors and the number of one to zero bit errors.

While apparatus 1000 is illustrated being external to the flash memory device 1080, in one embodiment the apparatus 1000 may be located in the flash memory device 1080 or may be incorporated into the flash memory device 1080. Similarly, apparatus 800 (FIG. 8) may be incorporated into or located in flash memory device 820 (FIG. 8) and apparatus 900 (FIG. 9) may be incorporated into or located in flash memory device 940 (FIG. 9).

In one embodiment, where the flash memory device 1080 is an SLC device, the adaptation logic 1060 is configured to determine a $V_{ref}$ adaptation for a first portion of a vector associated with the multi-level cell. In this embodiment, the adaptation logic 1060 is configured to determine a $V_{ref}$ adaptation for a second portion of the vector as a function of the $V_{ref}$ adaptation for the first portion. In one embodiment, the $V_{ref}$ adaptation for the second portion is the same as the $V_{ref}$ adaptation for the first portion while in another embodiment the $V_{ref}$ adaptation for the second portion is a scaled amount of the $V_{ref}$ adaptation for the first portion.

Figure 11:
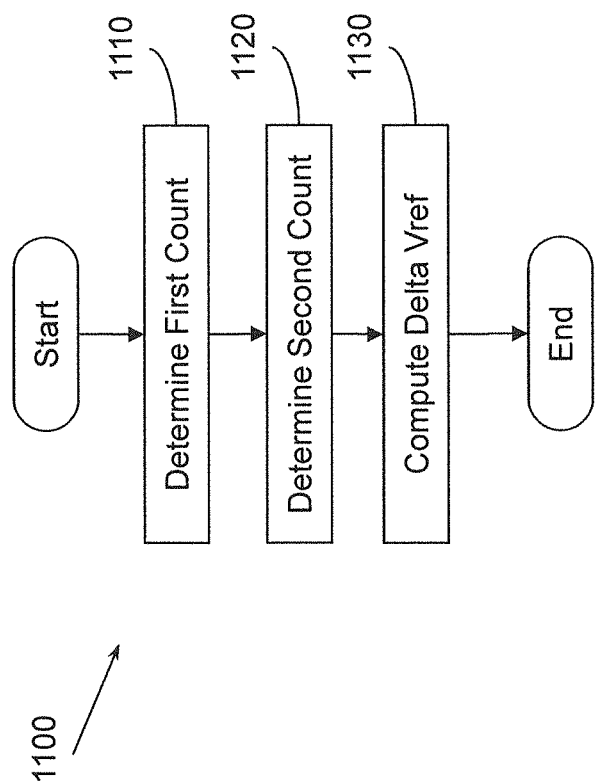
FIG. 11 illustrates a method associated with adapting read reference voltages in flash memory devices.

FIG. 11 illustrates a method 1100 for computing an adaptation to a reference voltage for a flash memory device. Method 1100 includes, at 1110, determining a first count of a number of first items determined by reading a flash memory device using a reference voltage. Method 1100 also includes, at 1120, determining a second count of a number of second items determined by reading a flash memory device using the reference voltage. In one embodiment, the first items are ones and the second items are zeroes. In another embodiment, the first items are zero to one errors and the second items are one to zero errors.

Method 1100 also includes, at 1130, computing an adaptation to the reference voltage as a function of a difference between the first count and the second count. The adaptation is computed to balance the difference between the first count and the second count. In different embodiments, method 1100 can acquire the first items and the second items using binary reads or using fractional reads.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Logic", as used herein, includes but is not limited to hardware, firmware, instructions stored on a non-transitory medium or in execution on a machine, and/or combinations of each to perform a function(s) or an action(s), and/or to cause a function or action from another logic, method, and/or system. Logic may include a software controlled microprocessor, a discrete logic (e.g., ASIC), an analog circuit, a digital circuit, a programmed logic device, a memory device containing instructions, and so on. Logic may include one or more gates, combinations of gates, or other circuit components. Where multiple logics are described, it may be possible to incorporate the multiple logics into one physical logic. Similarly, where a single logic is described, it may be possible to distribute that single logic between multiple physical logics. One or more of the components and functions described herein may be implemented using one or more of the logic elements.

While for purposes of simplicity of explanation, illustrated methodologies are shown and described as a series of blocks. The methodologies are not limited by the order of the blocks as some blocks can occur in different orders and/or concurrently with other blocks from that shown and described. Moreover, less than all the illustrated blocks may be used to implement an example methodology. Blocks may be combined or separated into multiple components. Furthermore, additional and/or alternative methodologies can employ additional, not illustrated blocks.

To the extent that the term "includes" or "including" is employed in the detailed description or the claims, it is intended to be inclusive in a manner similar to the term "comprising" as that term is interpreted when employed as a transitional word in a claim.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the disclosure is not limited to the specific details, the representative apparatus, and illustrative examples shown and described. Thus, this application is intended to embrace alterations, modifications, and variations that fall within the scope of the appended claims.

What is claimed is:

1. A method, comprising:
    determining a reference voltage adaptation for a reference voltage used in a flash memory device as a function of a first count of items read from the flash memory device and a second count of items read from the flash memory device; and
    shifting the reference voltage by an amount based at least in part by the reference voltage adaptation.

2. The method of claim 1, wherein the first count of items are determined by a number of ones read from the flash memory device and the second count of items are determined by a number of zeroes read from the flash memory device.

3. The method of claim 1, wherein the first count of items are determined by a number of one-to-zero bit errors experienced by the flash memory device and the second count of items are a number of zero-to-one bit errors experienced by the flash memory device.

4. The method of claim 1, wherein the function is determined based at least in part on a determining a difference between the first count of items and the second count of items.

5. The method of claim 1, wherein the shifting includes modifying the reference voltage by an amount based at least in part on the reference voltage adaptation.

6. An apparatus for adapting reference voltages in a flash memory device, comprising:
    reference voltage logic configured to determine a reference voltage associated with the flash memory device; and
    adaptation logic configured to determine a reference voltage adaptation for the flash memory device as a function of (i) a number of first items determined by reading the flash memory device using the reference voltage, and (ii) a number of second items determined by reading the flash memory device using the reference voltage;
    wherein the adaptation logic is configured to shift the reference voltage by an amount based at least in part on the reference voltage adaptation.

7. The apparatus of claim 6, wherein the number of first items is a number of one values read from the flash memory device and the number of second items is a number of zero values read from the flash memory device.

8. The apparatus of claim 6, wherein the number of first items is determined by a number of one-to-zero bit errors detected in the flash memory device and the number of second items is a number of zero-to-one bit errors detected in the flash memory device.

9. The apparatus of claim 6, further comprising read logic configured to read values from flash cells in the flash memory device.

10. The apparatus of claim 9, wherein the read logic is further configured to read the values using binary read outs or fractional read outs; and
    wherein the adaptation logic is further configured to determine the reference voltage adaptation based at least in part on a number of one values read and a number of zero values read.

11. The apparatus of claim 6, further comprising:
  error data logic configured to read error correction values associated with values read from the flash memory device;
  error type logic configured to (i) determine a number of zero-to-one bit errors as a function of the values and the error correction values; and (ii) determine a number of one-to-zero bit errors as a function of the values and the error correction values; and
  wherein the adaptation logic is further configured to determine the reference voltage adaptation for the flash memory device as a function of (i) the reference voltage, (ii) the number of one-to-zero bit errors, (iii) the number of zero-to-one bit errors, and (iv) a total number of errors.

12. The apparatus of claim 6, wherein the apparatus is implemented in the flash memory device.

13. The apparatus of claim 6, wherein:
  the adaptation logic being further configured to determine a $V_{ref}$ adaptation for a first portion of a vector associated with a multi-level cell of the flash memory device, and
  the adaptation logic being further configured to determine a $V_{ref}$ adaptation for a second portion of the vector as a function of the $V_{ref}$ adaptation for the first portion.

14. The apparatus of claim 13, wherein the $V_{ref}$ adaptation for the second portion is a scaled amount of the $V_{ref}$ adaptation for the first portion.

15. A memory device, comprising:
  memory cells;
  read logic configured to read values from the memory cells, wherein the read logic is configured to use a reference voltage; and
  adaptation logic configured to determine a reference voltage adaptation for the reference voltage as a function of a first count of values read from the memory cells and a second count of values read from the memory cells;
  wherein the adaptation logic is configured to adjust the reference voltage by an amount based at least in part by the adaptation.

16. The memory device of claim 15, wherein the first count of values are a number of one values read from the memory cells and the second count of values are a number of zero values read from the memory cells.

17. The memory device of claim 15, wherein the first count of values are a number of one-to-zero bit errors detected in the memory device and the second count of values are a number of zero-to-one bit errors detected in the memory device.

18. The memory device of claim 15, wherein the adaptation logic is configured to apply the function based at least in part on a difference between the first count of values and the second count of values.

19. The memory device of claim 15, wherein the memory device is a flash memory device.

* * * * *